US012566964B2

(12) United States Patent
Lee et al.

(10) Patent No.: US 12,566,964 B2
(45) Date of Patent: Mar. 3, 2026

(54) CAPACITOR DEVICE FOR UNIT SYNAPSE, UNIT SYNAPSE AND SYNAPSE ARRAY BASED ON CAPACITOR

(71) Applicant: Seoul National University R&DB FOUNDATION, Seoul (KR)

(72) Inventors: Jong-Ho Lee, Seoul (KR); Hyeong-Su Kim, Seoul (KR)

(73) Assignee: SEOUL NATIONAL UNIVERSITY R&DB FOUNDATION, Seoul (KR)

( * ) Notice: Subject to any disclaimer, the term of this patent is extended or adjusted under 35 U.S.C. 154(b) by 808 days.

(21) Appl. No.: 17/967,373

(22) Filed: Oct. 17, 2022

(65) Prior Publication Data

US 2023/0125501 A1    Apr. 27, 2023

(30) Foreign Application Priority Data

Oct. 25, 2021    (KR) ......................... 10-2021-0142489

(51) Int. Cl.
| | |
|---|---|
| *G06N 3/084* | (2023.01) |
| *G11C 11/24* | (2006.01) |
| *G11C 11/54* | (2006.01) |
| *H10D 1/66* | (2025.01) |
| *H10D 84/00* | (2025.01) |

(52) U.S. Cl.
CPC .............. *G06N 3/084* (2013.01); *G11C 11/24* (2013.01); *G11C 11/54* (2013.01); *H10D 1/66* (2025.01); *H10D 84/206* (2025.01)

(58) Field of Classification Search
CPC ...... G06N 3/084; G06N 3/0495; G06N 3/065; G06N 3/063; G11C 11/24; G11C 11/54; G11C 16/0466; G11C 11/404; H10D 1/66; H10D 84/206; H10D 1/692; H10D 84/212

See application file for complete search history.

(56) References Cited

U.S. PATENT DOCUMENTS 8,309,445 B2 * 11/2012 Chang ..................... H10D 1/66
438/525

FOREIGN PATENT DOCUMENTS

| KR | 20170055031 A | 5/2017 |
|---|---|---|
| KR | 20180133073 A | 12/2018 |

OTHER PUBLICATIONS

Kwon, et al., Capacitive Neural Network Using Charge-Stored Memory Cells for Pattern Recognition Applications, IEEE Electron Device Letters, Mar. 2020, vol. 41, No. 3, pp. 493-496.

* cited by examiner

*Primary Examiner* — Allison Bernstein
(74) *Attorney, Agent, or Firm* — CANTOR COLBURN LLP

(57) ABSTRACT

Provided is a capacitor device, a unit synapse using the capacitor device, a synapse array using the unit synapses. The capacitor device comprises a semiconductor layer which include first and second doping regions formed to be spaced apart from each other and a body region formed between the first and second doping regions; a gate electrode provided above the body region; and a gate insulator stack to have a memory function and disposed between the gate electrode and the semiconductor layer. The capacitance between the gate electrode and the first doping region is determined according to information stored in the gate insulator stack, and the state of the capacitor device is determined according to the capacitance to be one of two preset states. The unit synapse comprises a pair of capacitor devices to perform an XNOR operation.

20 Claims, 10 Drawing Sheets

FIG. 2A
FIG. 2B
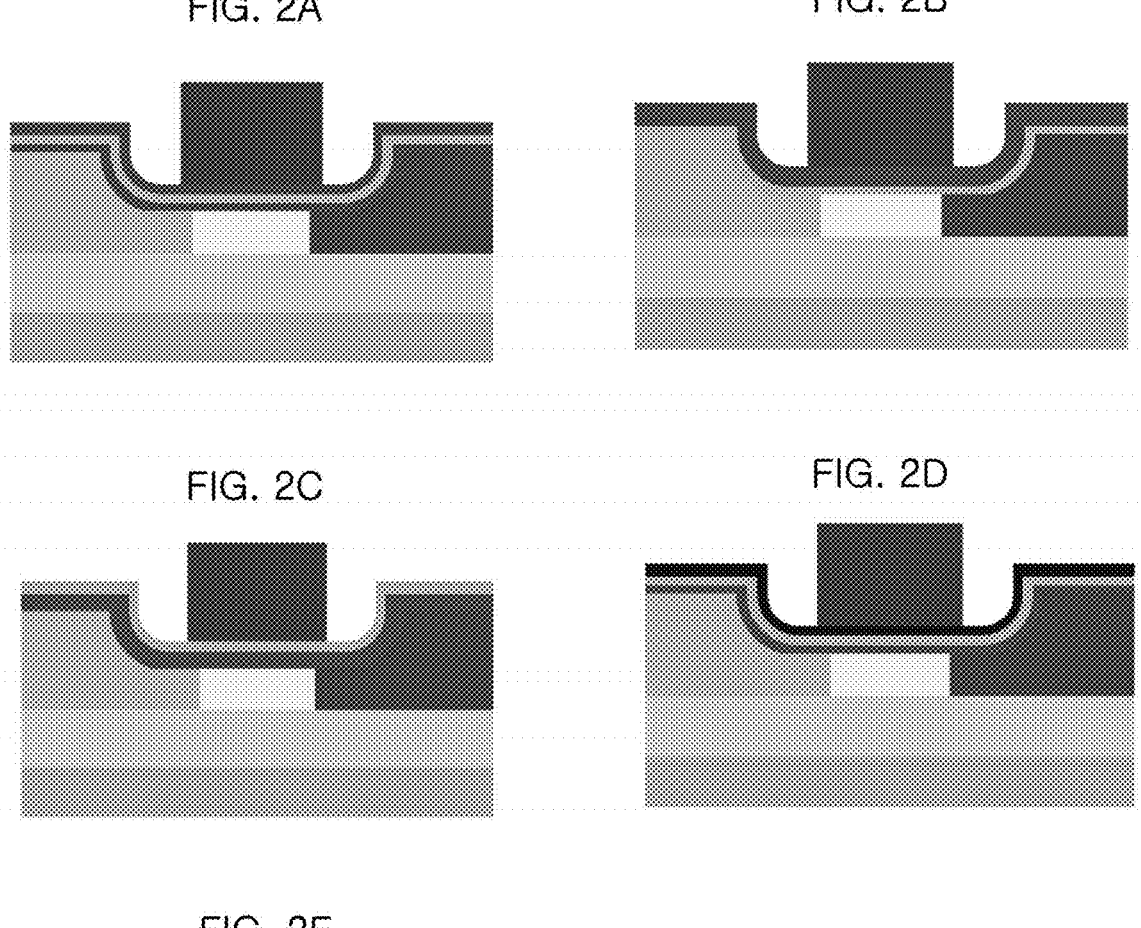
FIG. 2C
FIG. 2D
FIG. 2E
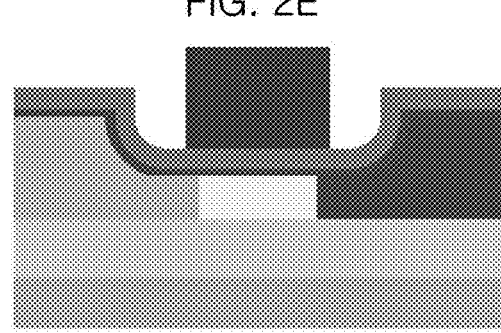

<u>20</u>

| D11 | D12 | 1st Capacitor Dev. | 2nd Capacitor Dev. | Input | Weight | Output |
|---|---|---|---|---|---|---|
| VDD | 0 | ON State | OFF State | 1 | 1 | 1 |
| 0 | VDD | ON State | OFF State | −1 | 1 | −1 |
| VDD | 0 | OFF State | ON State | 1 | −1 | −1 |
| 0 | VDD | OFF State | ON State | −1 | −1 | 1 |

US:Unit Synapse

VC:Voltage Comparator

VC:Voltage Comparator

US:Unit Synapse

US:Unit Synapse

VC:Voltage Comparator

CAPACITOR DEVICE FOR UNIT SYNAPSE, UNIT SYNAPSE AND SYNAPSE ARRAY BASED ON CAPACITOR

TECHNICAL FIELD

The present invention relates to a neuromorphic technology that can be applied to various neural networks, including binary neural networks, more specifically, to a capacitor device configured to determine a state according to the capacitance which is formed between the gate electrode and the first doping region and is determined according to information stored in the gate insulator stack having a memory function, a unit synapse using the capacitor device, a synapse array, and a method of operating the synapse array.

BACKGROUND ART

In recent years, many approaches have been made to imitate nervous systems of animals as power consumption has increased significantly and heat release problems have become more serious in integrated circuits based on the von Neumann architecture. Particularly, in the techniques imitating the nervous systems of animals, it is possible to improve the cognitive function and the determining function by enabling cognitive function and learning while greatly reducing power consumption. As a result, there is an opportunity to replace or greatly improve the functionality of the existing von Neumann integrated circuits. Therefore, much attention has been increasingly paid to the techniques, and the need for research has been greatly increased.

The basic function of neurons is to generate electrical spikes and transmit information to other cells in a case where a stimulus exceeds a threshold value. The resulting electrical signal is called an action potential. Neurons may be roughly divided into three portions. The neuron includes a nerve cell body where a nucleus exists, a dendrite which receives a signal from another cell, and an axon which transmits a signal to another cell. A portion which transmits a signal between the dendrites is called a synapse.

The neuron receives a stimulus from another nerve cell or a stimulus receptor cell and transmits the stimulus to another nerve cell or a glandular cell. Exchanging the stimulus occurs at the synapse. One nerve cell (neuron) receives stimuli through a number of synapses and integrates the excitations, and after that, the nerve cell transmits an electrical spike to an axon near to the nerve cell body, so that the electrical spike reaches the synapse.

In this manner, the transmission of the excitations from the neuron through the synapses to another nerve cell is referred to as excitation transmission. The excitation at the synapse is transmitted only from a nerve fiber toward a nerve cell body or a dendrite and is not transmitted in the reverse direction, so that the excitation is transmitted in only one direction as a whole.

In addition, the synapses are not only relay sites that transmit the excitations but the synapses also cause weighting or inhibition according to temporal or spatial change in excitations reaching the synapses to enable higher level integration of the nervous system.

On the other hand, besides the synapses having the action of transmitting the excitation, there are synapses having the action of inhibiting the transmission of the excitations from other nerve cells. These synapses are called inhibitory synapses. When the excitation transmitted along some nerve fibers reaches the inhibitory synapse, the inhibitory transmitting material is secreted from the synapse. This inhibitory transmitting material acts on a cell membrane of the nerve cell connected to the synapse to inhibit the excitations of the cell from occurring (occurrence of an action potential). As a result, while the inhibitory transmitting material acts, the excitation reaching other synapses is not transmitted to the synapse.

Recently, a study on a capacitor neural network using a synaptic device that controls capacitance by using a charge storage memory device was published (D. Kwon and I. Chung, "Capacitive Neural Network Using Charge-Stored Memory Cells for Pattern Recognition Applications" in IEEE Electron Device Letters, vol. 41, no. 3, pp. 493-496, March 2020, doi: 10.1109/LED.2020.2969695). However, when many levels of weights are used using the above-described conventional technique, there is a disadvantage in that accuracy is reduced due to the distribution of the threshold voltage of the device.

Recently, binary neural networks that perform forward propagation and backward propagation by limiting the values of synapses and neurons to −1 and 1 have been actively studied. Binary neural networks are advantageous in terms of area and power by removing the multiplier, and since they use only two values as information of synapses and neurons, the burden on synaptic devices and peripheral circuits can be greatly reduced.

In the present invention, in order to solve the decrease in accuracy due to the dispersion of the threshold voltage of the device, a capacitor device structure capable of performing calculation of a binary neural network is devised, and a unit synapse constructed using the capacitor device, a synapse array using the unit synapses, and a method of operating the synapse array are proposed.

SUMMARY OF THE INVENTION

An object of the present invention is to provide a capacitor device configured by using a capacitance between a gate electrode and a first doping region formed by information stored in a gate insulator stack having a memory function. The capacitor device according to the present invention is characterized in that it has excellent reliability and low power characteristics while solving problems such as a decrease in accuracy due to threshold voltage dispersion of the conventional synapse device.

Another object of the present invention is to provide a unit synapse configured to enable binary operation such as XNOR by connecting the above-described capacitor devices in pairs.

Another object of the present invention is to provide a synapse array configured by arranging the above-described unit synapses in an array form and an operating method of the synapse array for performing binary operations.

According to one aspect of the present invention, there is provided a capacitor device, which comprises a substrate having an insulating layer formed on its surface; a semiconductor layer provided on the insulating layer, which includes first and second doping regions formed to be spaced apart from each other by a predetermined distance in the semiconductor layer and each doped with different types of impurities and a body region formed between the first doping region and the second doping region; a gate electrode provided above the body region and electrically isolated from the body region; and a gate insulator stack configured to have a memory function capable of storing information in a non-volatile form and disposed between the gate electrode and the semiconductor layer, wherein the capacitance between the gate electrode and the first doping region is determined according to information stored in the gate insulator stack, and the state of the capacitor device is determined according to the capacitance to be one of two preset states.

In the capacitor device according to the present invention, preferably the body region is formed to have a thickness smaller than that of the first and second doping regions, so that a ratio of capacitances for the two preset states is increased, and resistances of the first and second doping regions are reduced.

In the capacitor device according to the present invention, preferably the body region is not doped with impurities or is doped with the same type of impurities as the first doping region but is doped lower than the first doping region.

In the capacitor device according to the present invention, preferably the gate insulator stack has a stack structure in which a charge storage layer and one or more insulating layers are stacked.

In the capacitor device according to the present invention, preferably the gate insulator stack is configured to include an insulating layer having a thickness of 4 nm or less between the body region and the charge storage layer or not to include an insulating layer between the body region and the charge storage layer, so as to reduce the program and erase operating voltages.

In the capacitor device according to the present invention, preferably the gate insulator stack includes an insulating layer disposed on the semiconductor layer and a ferroelectric layer disposed between the insulating layer and the gate electrode.

In the capacitor device according to the present invention, preferably according to the information stored in the gate insulator stack, in the body region the carriers are induces to form an accumulation layer or an inversion layer, or a carrier-free depletion state is formed, and there is no current flow between the first doping region and the second doping region.

According to another aspect of the present invention, there is provided a method of operating the capacitor device according to the first aspect described above, which comprises (a) applying a preset program voltage to the gate electrode to store information in the gate insulator stack, thereby forming carrier accumulation layer or an inversion layer in the body region by the stored information in a floating state of the gate electrode, forming a capacitance greater than a preset reference value between the gate electrode and the first doping region by the accumulation layer or the inversion layer; and (b) applying a preset erase voltage to the gate electrode to store information stored in the gate insulator stack, thereby forming a carrier-free depletion state in the body region in a floating state of the gate electrode, forming a capacitance smaller than the reference value between the gate electrode and the first doping region according to a depletion state, wherein the state of the capacitor device is determined according to the capacitance of the gate electrode and the first doping region changed by information stored in the gate insulator stack.

In the method of operating the capacitor device according to the present invention, it is preferable that current does not flow between the first doping region and the second doping region.

According to another aspect of the present invention, there is provided a unit synapse, which comprises a pair of capacitor devices, the capacitor devices forming the pair share a gate electrode and are configured to have different states, wherein the capacitor device comprises a substrate having an insulating layer formed on its surface; a semiconductor layer provided on the insulating layer, which includes first and second doping regions formed to be spaced apart from each other by a predetermined distance in the semiconductor layer and each doped with different types of impurities and a body region formed between the first doping region and the second doping region; a gate electrode provided above the body region and electrically isolated from the body region; and a gate insulator stack configured to have a memory function capable of storing information in a non-volatile form and disposed between the gate electrode and the semiconductor layer, wherein the capacitance between the gate electrode and the first doping region is determined according to information stored in the gate insulator stack, and the state of the capacitor device is determined according to the capacitance to be one of two preset states.

In the unit synapse according to the present invention, preferably the gate insulator stack of the capacitor device has a stack structure in which a charge storage layer and one or more insulating layers are stacked.

In the unit synapse according to the present invention, preferably a first capacitor device constituting the unit synapse is characterized in that first carriers are stored in a charge storage layer of a gate insulator stack, and an inversion layer or an accumulation layer is formed in a body region by the stored first carriers, so that the body region is electrically connected to a first doping region of the first capacitor device; and a second capacitor device constituting the unit synapse is characterized in that second carriers of a type opposite to that of the first carrier are stored in a charge storage layer of a gate insulator stack, and a body region is depleted by the stored second carriers, so that the body region is not electrically connected to a first doping region of the second capacitor device.

In the unit synapse according to the present invention, preferably a value corresponding to a weight is stored in the gate insulator stack of the capacitor device, a voltage corresponding to an input signal is applied to a first doping region of the capacitor device, and the voltage of the gate electrode of the capacitor device is set as an output signal.

According to one aspect of the present invention, there is provided a synapse array based on capacitor, which comprises a plurality of unit synapses arranged in an array form, the unit synapse comprises a pair of capacitor devices, the capacitor devices forming the pair share a gate electrode and are configured to have different states, wherein the capacitor device comprises a substrate having an insulating layer formed on its surface; a semiconductor layer provided on the insulating layer which first and second doping regions formed to be spaced apart from each other by a predetermined distance in the semiconductor layer and each doped with different types of impurities and a body region formed between the first doping region and the second doping region; a gate electrode provided above the body region and electrically isolated from the body region; and a gate insulator stack configured to have a memory function capable of storing information in a non-volatile form and disposed between the gate electrode and the semiconductor layer, wherein the capacitance between the gate electrode and the first doping region is determined according to information stored in the gate insulator stack, and the state of the capacitor device is determined according to the capacitance to be one of two preset states.

In the synapse array based on capacitor according to the present invention, preferably the gate insulator stack of the capacitor device has a stack structure in which a charge storage layer and one or more insulating layers are stacked.

5

In the synapse array based on capacitor according to the present invention, preferably a first capacitor device constituting the unit synapse is characterized in that first carrier are stored in a charge storage layer of a gate insulator stack, and an inversion layer or an accumulation layer is formed in a body region by the stored first carriers, so that the body region is electrically connected to a first doping region of the first capacitor device; and a second capacitor device constituting the unit synapse is characterized in that second carriers of a type opposite to that of the first carriers are stored in a charge storage layer of a gate insulator stack, and a body region is depleted by the stored second carrier, so that the body region is not electrically connected to a first doping region of the second capacitor device.

In the synapse array based on capacitor according to the present invention, preferably the first doping regions of the capacitor devices included in the synapse array are connected to each other and the second doping regions of the capacitor devices are connected to each other, so as to reduce the contact area of a metal electrode and increase the degree of integration.

In the synapse array based on capacitor according to the present invention, preferably the synapse array further comprises a first peripheral circuit configured to apply an input signal to first electrodes connected to the first doping regions or to second electrodes connected to the second doping regions of the capacitor devices included in the synapse array.

In the synapse array based on capacitor according to the present invention, preferably the synapse array further comprises: a plurality of word-lines connected to each of the plurality of unit synapses; and a second peripheral circuit in which two word-lines constitute a pair and the second peripheral circuit comprises a plurality of comparators configured to compare the first and second word-lines constituting the pair, wherein the weight of the synapse connected to the first word-line constituting the pair and the weight of the synapse connected to the second word-line are set to be opposite to each other, and the second peripheral circuit is configured to provide an output by comparing the voltages of the word-lines being in a floating state through a read operation in a state in which the same input signal are applied.

In the synapse array based on capacitor according to the present invention, preferably the synapse array further comprises: a plurality of word-lines connected to each of the plurality of unit synapses; and a second peripheral circuit in which two word-lines constitute a pair and the second peripheral circuit comprises a plurality of comparators configured to compare the first and second word-lines constituting the pair, wherein synapses connected to the first word-line constituting the pair are set to have weight information and synapses connected to the second word-line are set to have information forming a reference voltage, and the second peripheral circuit is configured to provide an output by comparing the voltages of the word-lines being in a floating state through a read operation in a state in which each input signal is applied.

In the synapse array based on capacitor according to the present invention, preferably the synapse array further comprises: a plurality of word-lines connected to each of the plurality of unit synapses; and a second peripheral circuit including a plurality of comparators configured to respectively compare the plurality of word-lines with a reference voltage, wherein the second peripheral circuit is configured to provide an output by comparing a voltage of the word-line being in a floating state with a reference voltage through a read operation in a state in which input signal is applied.

In the synapse array based on capacitor according to the present invention, preferably the synapse array further comprises: a plurality of word-lines connected to each of the plurality of unit synapses; and a second peripheral circuit including a plurality of comparators configured to respectively compare the plurality of word-lines with a reference voltage, wherein at least one of the two input elements of the comparator is an element having a non-volatile memory function, and the conductance of the input element having a non-volatile memory function is determined according to the polarity or amount of charge stored in the input voltage, and the second peripheral circuit is configured to provide an output by comparing a voltage of the word-line being in a floating state with a reference voltage through a read operation in a state in which input signal is applied.

According to the present invention, by performing the binary operation using the capacitor device of the present invention, it is possible to greatly improve the decrease in accuracy due to the distribution of the threshold voltage of the device. In addition, since the capacitor device according to the present invention is implemented using a flash memory function including a charge storage layer, durability and reliability are excellent. In addition, the capacitor-based synapse array according to the present invention can perform operations required for a binary neural network with high accuracy and low power consumption.

BRIEF DESCRIPTION OF THE DRAWINGS

FIGS. 2A to 2E area cross-sectional view illustrating various embodiments of the structure of a gate insulator stack in the capacitor device according to the first embodiment of the present invention.

DETAILED DESCRIPTION OF THE INVENTION

Hereinafter, with reference to the accompanying drawings, a capacitor device, a unit synapse made of a pair of the capacitor device, a capacitor-based synapse array configured by arranging a plurality of unit synapses in an array form, and an operating method of the synapse array according to a preferred embodiment of the present invention will be described in detail.

<Capacitor Device>

Hereinafter, the structure and operation of the capacitor device according to the first embodiment of the present invention will be described in detail.

Figure 1:
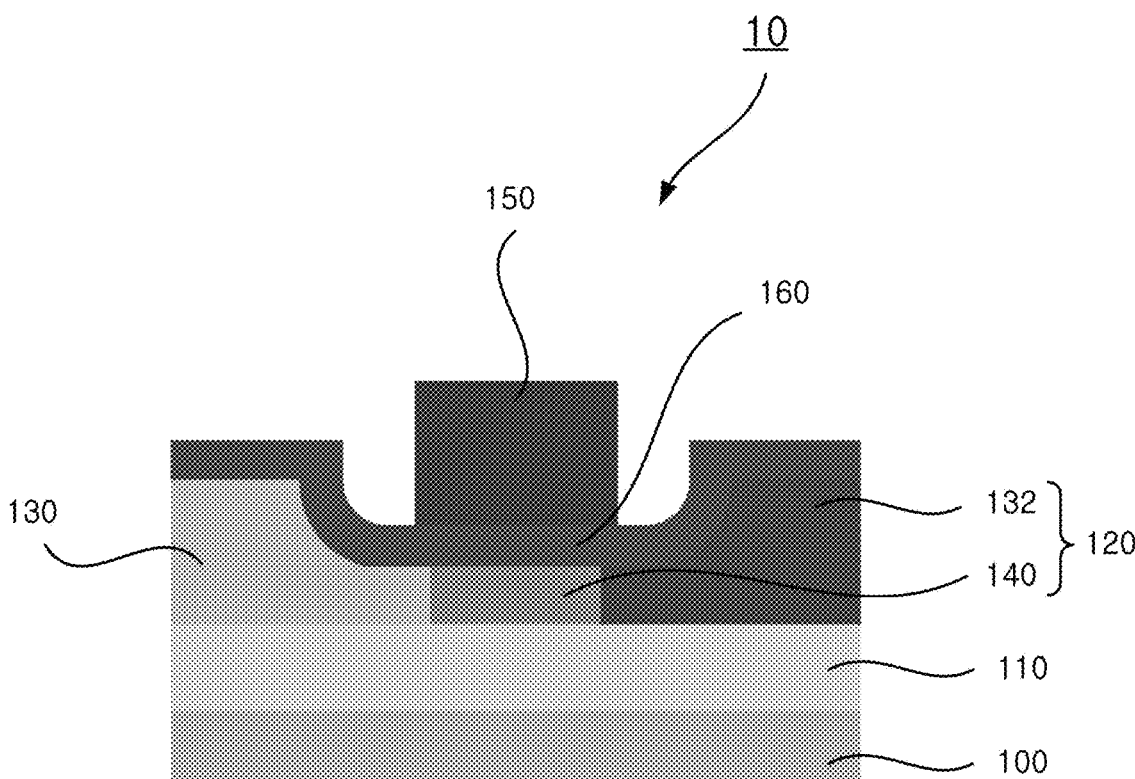
FIG. 1 is a cross-sectional view illustrating a capacitor device according to a first embodiment of the present invention.

FIG. 1 is a cross-sectional view illustrating a capacitor device according to a first embodiment of the present invention. Referring to FIG. 1, the capacitor device 10 according to the present embodiment includes a substrate 100, an insulating layer 110 formed on a surface of the substrate to electrically insulate the substrate, a semiconductor layer 120 which includes first and second doping regions 130 and 132 formed to be spaced apart from each other in the semiconductor layer and a body region 140 formed between the first and second doping regions, a gate electrode 150 provided above the body region, a gate insulator stack 160 formed between the gate electrode and the body region, first and second electrodes (not shown) electrically connected to the first and second doping regions, respectively; and an isolation insulating layer (not shown) electrically isolating the first and second electrodes from the gate electrode.

The substrate 100 and the semiconductor layer 120 are electrically insulated by the insulating layer 110, and the semiconductor layer 120 may be formed by depositing polysilicon on the insulating layer 110. The first and second doping regions and the body region are formed in the semiconductor layer.

Preferably, the body region 140 has a larger particle size and a thinner thickness than the first and second doping regions to improve charge mobility. In particular, it is preferable to form a thickness of 20 nm or less using an oxidation process or the like. The gate electrode 150 is positioned above the body region 140 and a gate insulator stack 160 is disposed between the gate electrode and the body region. Accordingly, the gate electrode and the body region are electrically isolated from each other by the gate insulator stack interposed therebetween.

The first and second electrodes are metal wires electrically connected to the first and second doping regions, respectively, and the isolation insulating layer is an insulating layer formed between the first and second electrodes and the gate electrode, configured to electrically isolate the first and second electrodes and the gate electrode.

In the capacitor device according to the present invention, the first and second doping regions and the body region may be implemented in various embodiments. The first doping region may be doped with n-type or p-type impurities. The body region may not be doped with impurities or may be doped with the same type of impurity as the first doping region, but with a lower concentration than the first doping region. Preferably, the second doping region is doped with impurities of a type opposite to that of the first doping region. In the first embodiment of the first and second doping regions and the body region, the first doping region is doped with n-type impurities, the body region is not doped with the impurity, and the second doping region is doped with p-type impurities different from those of the first doping region, so that holes can be sufficiently supplied to the body region during an erase operation. In the second embodiment for the first and second doping regions and the body region, the first doping region is doped with n-type impurities, and the body region is doped with the same type of impurities as the first doping region, but with a lower concentration than the first doping region, so that capacitance between the first doping region and the gate electrode in an initial state that is not programmed or erased can be increased. In this case, the second doping region is doped with p-type impurities different from those of the first doping region, so that holes can be sufficiently supplied to the body region during an erase operation.

In the capacitor device according to the present invention, the gate insulator stack 160 is positioned between the gate electrode and the body region of the semiconductor layer, and configured to have a memory function capable of storing information in a non-volatile form using a material causing at least a trap or polarization. The gate insulator stack preferably has a stack structure in which a plurality of layers including at least a charge storage layer and an insulating layer are stacked, and the structure of the gate insulator stack may be implemented in various embodiments. On the other hand, when the gate insulator stack includes a charge storage layer and an insulating layer, preferably, the insulating layer is not disposed between the semiconductor layer and the charge storage layer, or the insulating layer with a thickness of 4 nm or less is disposed even if it is disposed, in order to lower the operating voltage of the program or erase process.

FIG. 2A to 2E is a cross-sectional view illustrating various embodiments of the structure of a gate insulator stack in the capacitor device according to the first embodiment of the present invention. Referring to FIG. 2A to 2E, the gate insulator stack may be configured by stacking a plurality of insulating layers, and the plurality of insulating layers includes at least a charge storage layer which is an insulating layer with a trap for enabling charge storage, so that it becomes possible to implement a memory function that stores information in a non-volatile form. Referring to FIG. 2A, the gate insulator stack according to the first embodiment may be formed in a stacked structure of a first insulating layer positioned at the gate electrode side, a charge storage layer, and a second insulating layer positioned at the semiconductor layer side. Referring to FIG. 2B, it may be formed in a stacked structure of a first insulating layer on the gate electrode side and a charge storage layer. Referring to FIG. 2C, it may be formed in a stacked structure of a charge storage layer and a second insulating layer on the semiconductor layer side. Referring to FIG. 2D, the first insulating layer on the gate electrode side and the second insulating layer on the semiconductor layer side are formed of different materials, and may be formed in a stacked structure in which a charge storage layer is disposed between the first and second insulating layers. The insulating layer of the gate insulator stack may be formed of silicon oxide, aluminum oxide, or the like, and the charge storage layer may be formed of silicon nitride, hafnium oxide, or the like.

The gate insulator stack may be configured by stacking a plurality of insulating layers as shown in FIGS. 2A to 2D, and at least one of a plurality of insulating layers may be formed by using a polarization-inducing material to implement a memory function to store information in a non-volatile form. For example, as shown in FIG. 2E, it may be formed in a stacked structure of a polarization-inducing material layer and a second insulating layer on the semiconductor layer side.

The charge storage layer of the gate insulator stack may implement a memory function by being programmed or erased by injecting electron or hole carriers from the body region or the gate electrode. In this way, the capacitor device according to the present invention can store or delete preset information in the charge storage layer of the gate insulator stack through a program or erase operation.

In the capacitor device according to the present invention, assuming that the first doping region is doped with n-type impurities, when hole carriers are injected into the charge storage layer through a program operation, an inversion layer is formed in the body region and the body region is electrically connected to the first doping region. As a result, the gate electrode and the first doping region isolated from each other by the gate insulator stack have a capacitance greater than a preset reference value. Meanwhile, when hole carriers of the charge storage layer are removed or electron carriers are injected into the charge storage layer by using an erase operation, the body region is depleted not to be electrically connected to the first doping region. As a result, the capacitance between the gate electrode and the first doping region is less than a preset reference value.

At this time, since the first and second doping regions are doped with different types of impurities, even if an inversion layer or an accumulation layer is formed in the body region between the first doping region and the second doping region, no current flow except for an unintended leakage current occurs between the first doping region and the second doping region.

As described above, in the capacitor device according to the present invention, the capacitance formed between the gate electrode and the first doping region is determined according to information stored in the gate insulator stack. When the capacitance formed between the gate electrode and the first doping region is greater than a preset reference value, the first state is set, and the first state is referred to as an 'ON state' in the present specification for convenience of description. When the capacitance formed between the gate electrode and the first doping region is smaller than a preset reference value, the second state is set, and the second state is referred to as an 'OFF state' in this specification for convenience of description. Therefore, the capacitor device according to the present invention is determined to be one of the on/off states according to the capacitance formed between the gate electrode and the first doping region. Accordingly, the capacitor device according to the present invention has one of ON/OFF states determined according to the capacitance formed between the gate electrode and the first doping region in a state in which the gate electrode is floating.

Figure 3:
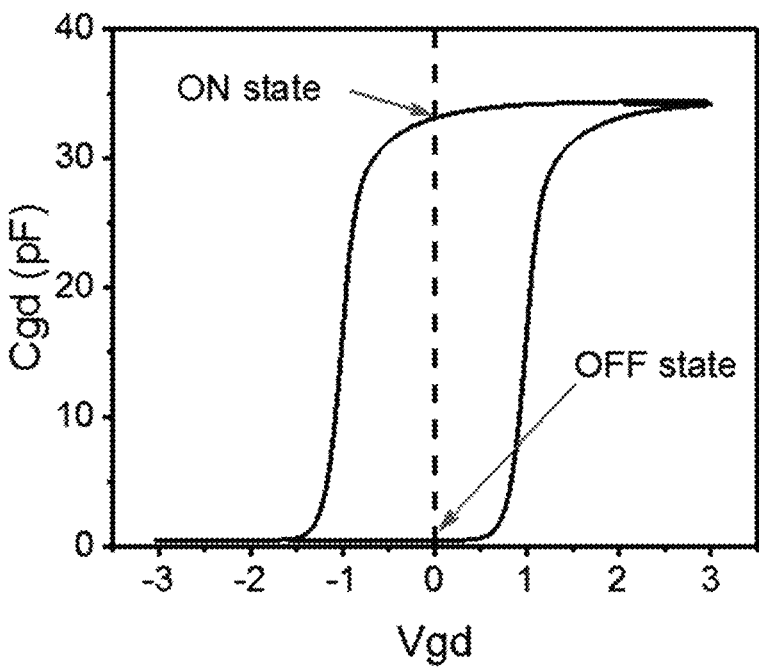
FIG. 3 is a graph showing the relationship of capacitance (Cgd)-Voltage (Vgd) between a gate electrode and a first doping region in an ON state and an OFF state, respectively, for a capacitor device according to a preferred embodiment of the present invention.

FIG. 3 is a graph showing the relationship of capacitance (Cgd)-Voltage (Vgd) between a gate electrode and a first doping region in an ON state and an OFF state, respectively, for a capacitor device according to a preferred embodiment of the present invention.

Referring to FIG. 3, in the capacitor device according to the present invention, assuming that the first doping region is doped with n-type impurities, when hole carriers are injected into the charge storage layer by applying Vgd to program the capacitor device, an inversion layer is formed in the body region and the body region is electrically connected to the first doping region. As a result, the gate electrode and the first doping region isolated from each other by the gate insulator stack are in an ON state in which the capacitance is greater than a preset reference value. On the other hand, when the capacitor device is erased by removing the hole carriers of the charge storage layer or by injecting electron carriers into the charge storage layer by applying Vgd, the body region is depleted so that the body region is not electrically connected to the first doping region. As a result, the gate electrode and the first doping region are in an OFF state in which capacitance is smaller than a preset reference value.

By using the capacitance between the gate electrode and the first doping region of the capacitor device according to the present invention having the above configuration, it is possible to perform a binary operation.

<Capacitor Device-Based Unit Synapse>

Hereinafter, a structure of a capacitor device-based unit synapse according to a second embodiment of the present invention and a method of performing an XNOR operation required for a binary neural network using the same will be described in detail.

Figures 4, 5:
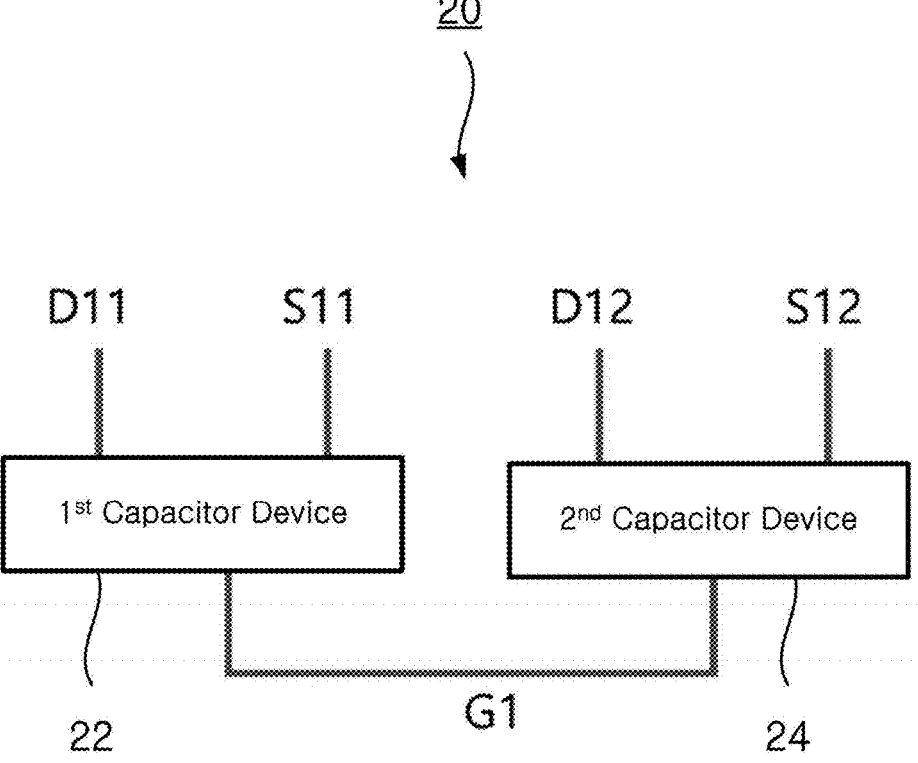
FIG. 4 is a structural diagram illustrating a unit synapse based on a capacitor device according to the second embodiment of the present invention.
FIG. 5 is a table in which input values, weights, and output values of a unit synapse for performing an XNOR operation are defined in a capacitor device-based unit synapse according to the second embodiment of the present invention.

FIG. 4 is a structural diagram illustrating a unit synapse based on a capacitor device according to the second embodiment of the present invention. Referring to FIG. 4, the capacitor device-based unit synapse 20 according to the second embodiment of the present invention consists of a first capacitor device 22 and a second capacitor device 24, which the first and second capacitor devices according to the first embodiment described above form a pair. Accordingly, the first capacitor device and the second capacitor device are constituted like the capacitor devices according to the first embodiment. In FIGS. 4, D11 and D12 denote first electrodes connected to the first doping regions of the first and second capacitor devices, respectively. S11 and S12 denote second electrodes connected to the second doping regions of the first and second capacitor devices, respectively. G1 denotes an electrode connected to the gate electrodes of the first and second capacitor devices.

In the unit synapse based on the capacitor device according to the present invention, the first and second capacitor devices constituting the unit synapse share a gate electrode with each other. In addition, in the capacitor device-based unit synapse according to the present invention, in the first capacitor device of the pair of capacitor devices, an inversion layer or an accumulation layer is formed in the body region by carriers stored in the charge storage layer of the gate insulator stack, so that the body region is electrically connected to the first doping region. As a result, it is preferable that the capacitance formed between the gate electrode and the first doping region of the first capacitor device is greater than a preset reference value to have an ON state. Further, in the second capacitor device of the pair of capacitor devices, opposite carriers are stored in the charge storage layer of the gate insulator stack, so that the body region is depleted, and as a result, the body region is not electrically connected to the first doping region. As a result, it is preferable that the capacitance formed between the gate electrode and the first doping region of the second capacitor device is smaller than a preset reference value to have an OFF state. Accordingly, the first and second capacitor devices constituting the unit synapse are configured to have different states, respectively, and the weight of the unit synapse, which will be described later, is determined according to a combination of states of the respective capacitor devices.

FIG. 5 is a table in which input values, weights, and output values of a unit synapse for performing an XNOR operation are defined in a capacitor device-based unit synapse according to the second embodiment of the present invention. In order to perform the XNOR operation in the unit synapse based on the capacitor device according to the present embodiment, G1 is put in a floating state with no voltage applied, and S11 and S12 may be put in a floating state, be applied 0 Volt, or be connected to D11 and D12 respectively.

Referring to FIG. 5, an input value may be one of 1 and −1, and is configured by a combination of voltages applied to D11 and D12. In the case of an input value, when a specific voltage (VDD) having a positive value is applied to D11 and 0V is applied to D12, the input value is '1', and when 0V is applied to D11 and a specific voltage (VDD) having a positive value is applied to D12, the input value is '−1'.

The weight may be one of 1 and −1, and is determined by a combination of ON/OFF states of the first and second capacitor devices. The first and second capacitor devices have one of ON/OFF states determined according to a capacitance between the gate electrode and the first doping region of each device. In the case of the weight, when the first capacitor device is in the ON state and the second capacitor device is in the OFF state, the weight is set to '1', and when the first capacitor device is in the OFF state and the second capacitor device is in the ON state, the weight is set to '−1'. In addition, the floating voltage of the output G1 is determined according to the input value and the weight. If the floating voltage of G1 is greater than ½*VDD, the output is determined as '1', and if the floating voltage of G1 is less than ½*VDD, the output is determined as '0'.

<Capacitor-Based Synapse Array>

Hereinafter, the structure and operation of a capacitor-based synapse array according to a third embodiment of the present invention will be described in detail with reference to the accompanying drawings. The capacitor-based synapse array according to the third embodiment of the present invention is characterized in that a plurality of unit synapses according to the above-described second embodiment are arranged in an array form to perform an operation required for a binary neural network. The synapse array according to the present embodiment preferably includes a first peripheral circuit for transmitting an input signal to the first electrode or the second electrode of the array in order to perform an operation required for the binary neural network. In addition, the synapse array according to the present embodiment preferably includes a second peripheral circuit for comparing the floating voltages of the gate electrodes that are the output of the unit synapses.

In addition, the synapse array according to this embodiment may further include peripheral circuits made of CMOS devices including NMOSFETs and PMOSFETs on the substrate. The CMOS devices are characterized in that the semiconductor layer includes first and second doping regions doped with the same type of impurities.

Figure 6:
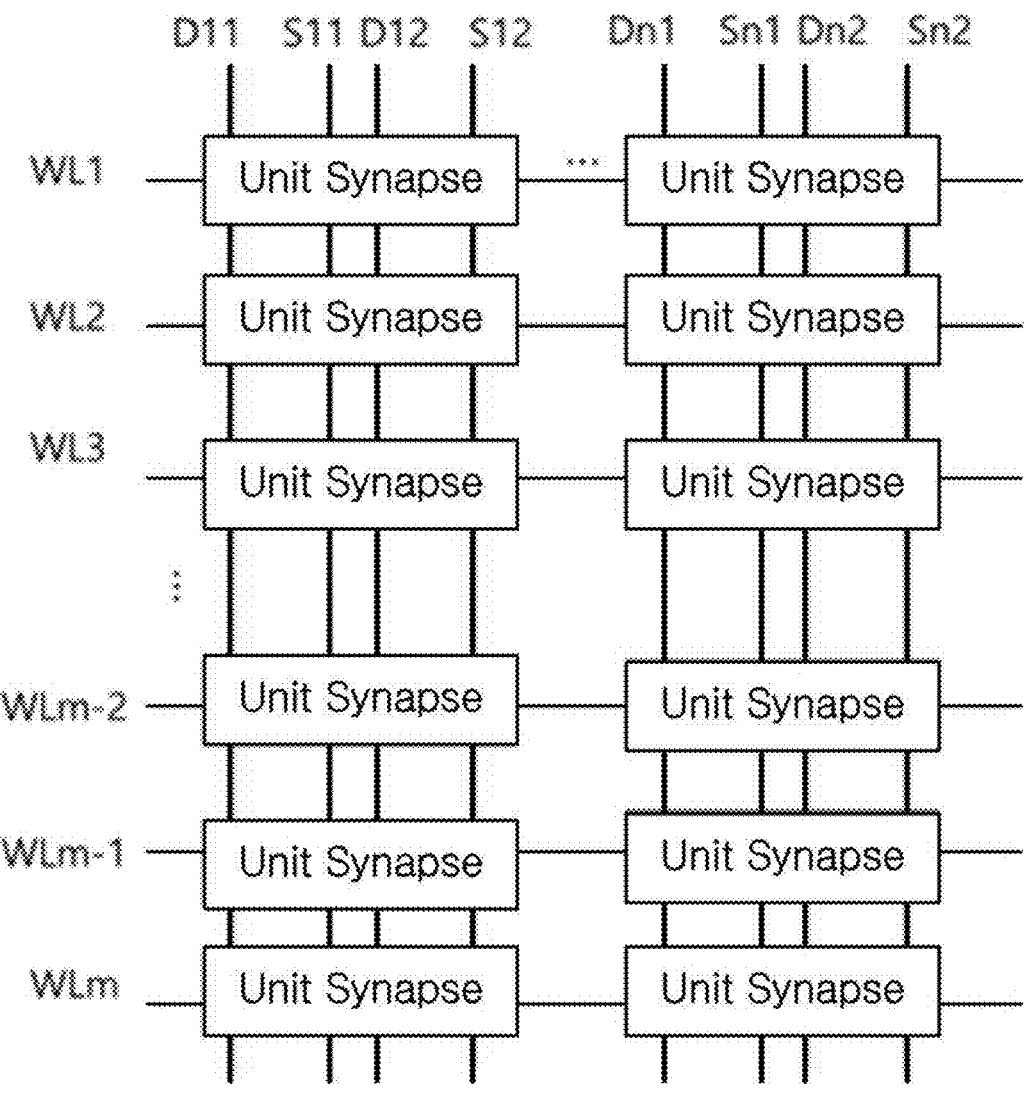
FIG. 6 is a structural diagram exemplarily showing a capacitor-based synapse array according to the third embodiment of the present invention.

FIG. 6 is a structural diagram exemplarily showing a capacitor-based synapse array according to the third embodiment of the present invention. Referring to FIG. 6, in the capacitor-based synapse array according to the present embodiment, preferably the m—metal lines for word-line (WL1, WL2, . . . , WLm) connecting the gate electrodes of the n—unit synapses and 2n—metal lines (D11~Dn1, D12~Dn2) connecting the two first doping regions of the unit synapse are arranged perpendicular to each other; and m—metal lines for word-line (WL1, WL2, . . . , WLm) connecting the gate electrode of the unit synapse and 2n—metal lines (S11~Sn1, S12~Sn2) connecting the two second doping regions of the unit synapse are aligned perpendicular to each other.

Figures 7A, 7B, 7C:
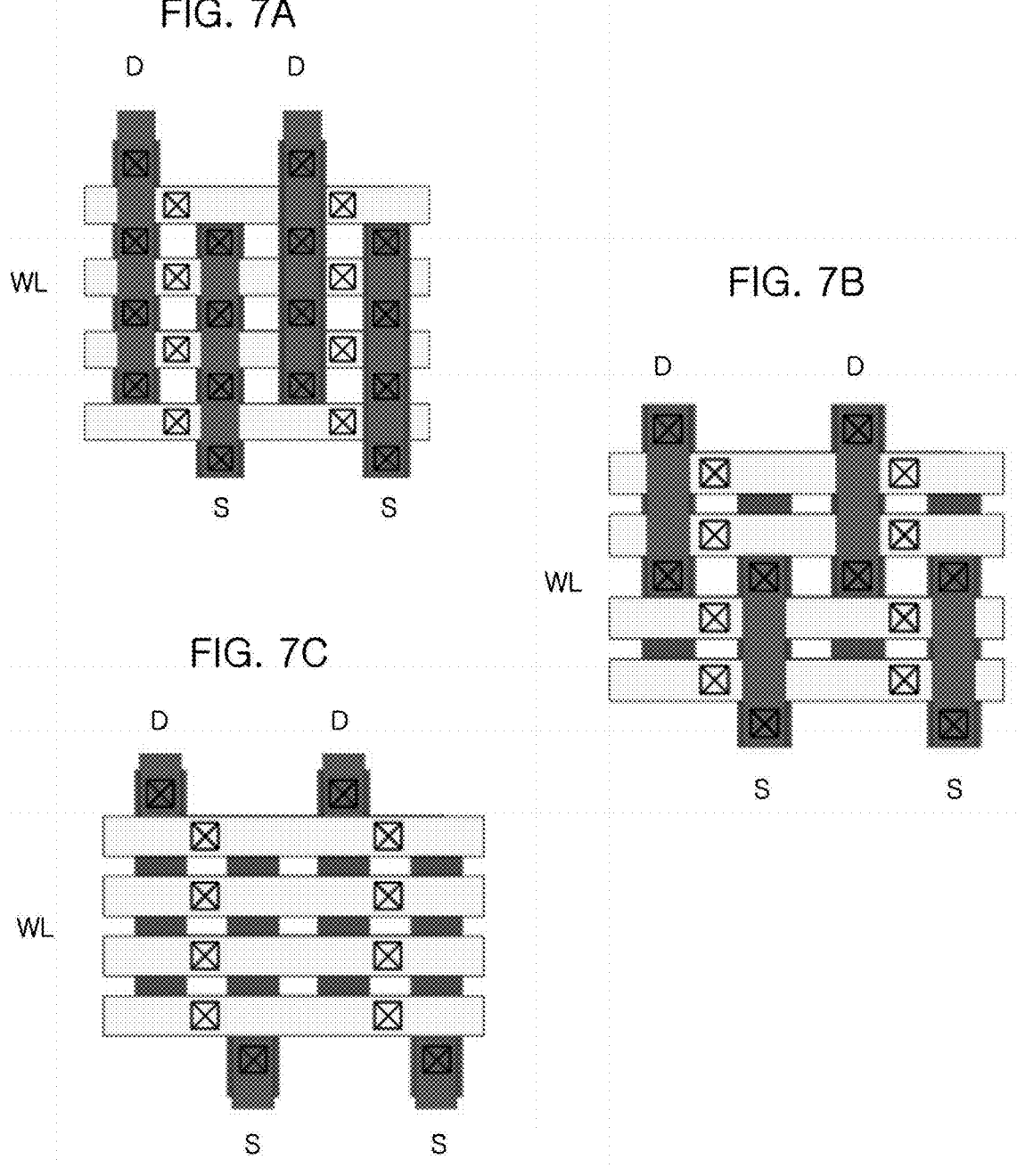
FIG. 7A to 7C are top views showing the shape of the array according to the contact method of the metal wire in the capacitor-based synapse array according to the third embodiment of the present invention.

FIG. 7A to 7C are top views showing the shape of the array according to the contact method of the metal wire in the capacitor-based synapse array according to the third embodiment of the present invention. Referring to FIG. 7A, the first doping region and the second doping region of all capacitor devices may be connected in an array form by contacting a metal line to them. Referring to FIGS. 7B and 7C, by connecting semiconductor regions corresponding to the first and second doping regions of each capacitor device, respectively, the number of contact areas required for the metal wiring is reduced, thereby increasing the degree of integration.

Figure 8A:
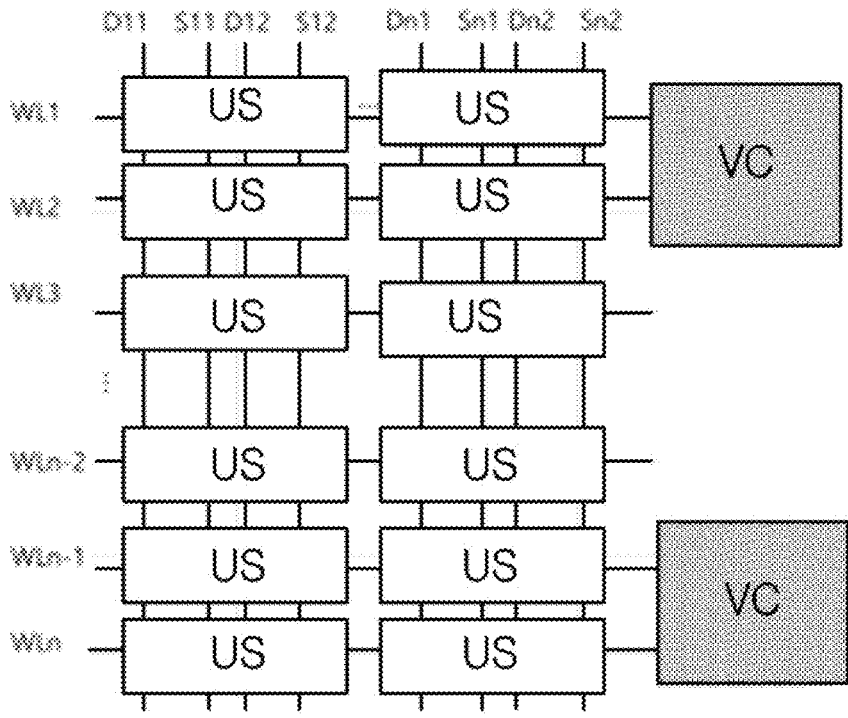
FIG. 8A to 8C are exemplary views illustrating the structure of a synapse array provided with a second peripheral circuit using a voltage comparison method in a capacitor-based synapse array according to the third embodiment of the present invention.
Figure 8B:
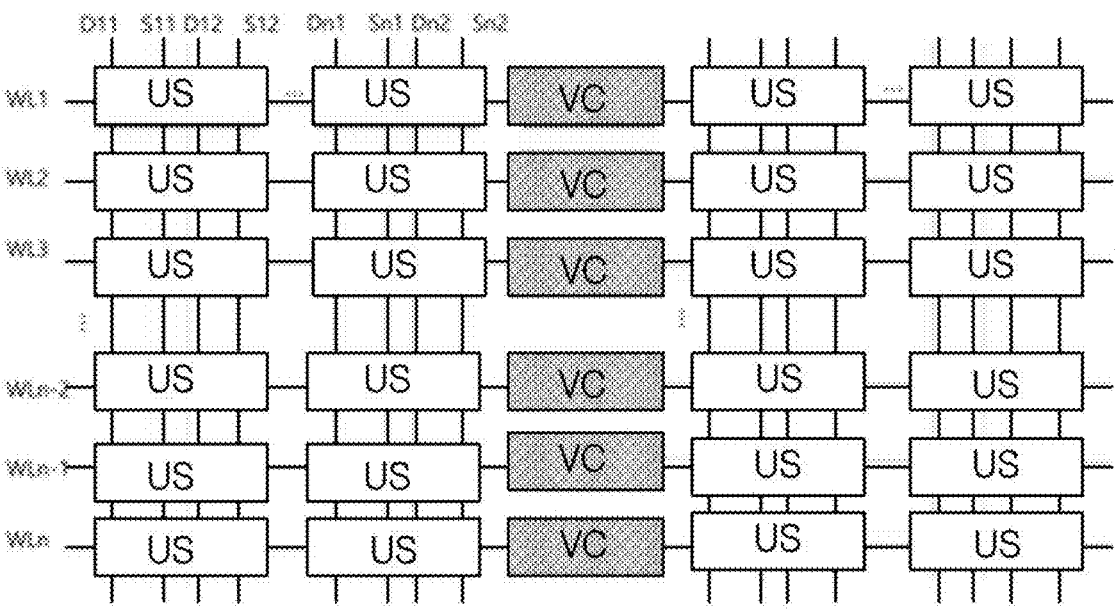
Figure 8C:
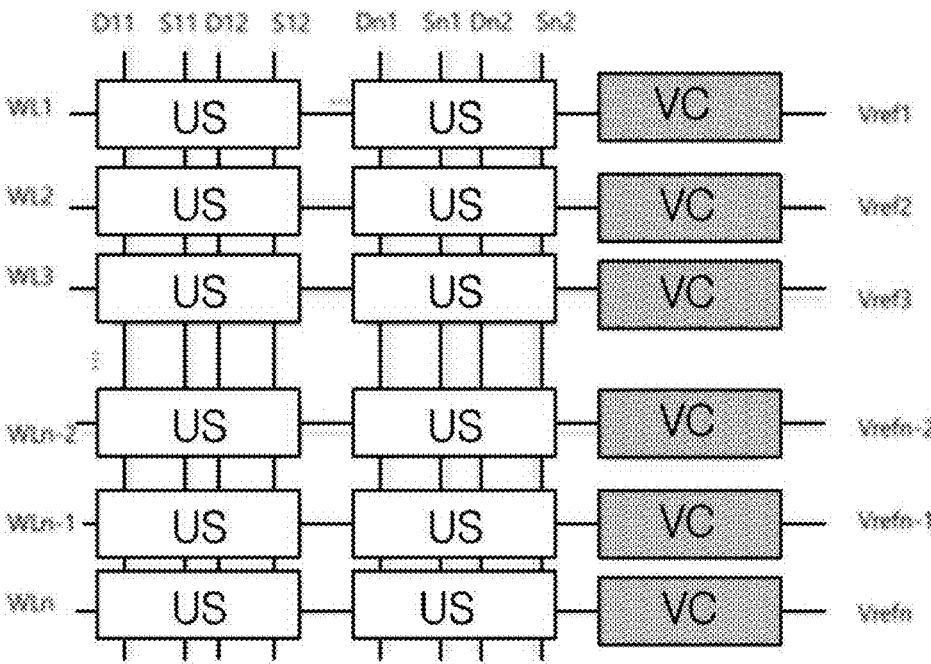

FIG. 8A to 8C are exemplary views illustrating the structure of a synapse array provided with a second peripheral circuit using a voltage comparison method in a capacitor-based synapse array according to the third embodiment of the present invention. Referring to FIG. 8A, the synapse array according to the present embodiment may further include a second peripheral circuit for comparing the floating voltages of two word-lines with each other and outputting a comparison result. The second peripheral circuit includes a voltage comparator that receives floating voltages of word-lines as input signals, compares the input signals and outputs the result. For example, a word-line pair is composed of first and second word-lines, and the first and second word-lines are compared in one voltage comparator.

After setting the weight ($W_1$) of the synapses connected to the first word-line and the weight ($W_2$) of the synapses connected to the second word-line, respectively, in a state in which the same input signal are applied, if the floating voltages of the first and second word-lines are compared by the read operation, $\Sigma W_1 I_1$ and $\Sigma W_2 I_1$ can be compared. After setting the weights of the synapses connected to the first word-line of the pair of word-lines and the weights of the synapses connected to the second word-line to be opposite to each other, in a state in which the same input signal are applied, if the floating voltages of the first and second word-lines are compared by the read operation, $\Sigma W_1 I_1$ and $\Sigma(-W_1)I_1$ can be compared, and as a result, the sign of $\Sigma W_1 I_1$ can be determined.

Referring to FIG. 8B, the synapse array according to the present embodiment may further include a second peripheral circuit that includes two arrays and compares the floating voltages of each word-line in the two arrays to provide an output value. In one example, the word-line pair consists of a first word-line of a first array and a first word-line of a second array, and the first word-lines of the first and second arrays are compared in a voltage comparator. After setting the weight ($W_1$) of the synapses connected to the first word-line of the first array and the weight ($W_2$) of the synapses connected to the first word-line of the second array, respectively, in a state in which different input signals ($I_1$, $I_2$) are applied, if the floating voltages of the word-lines are compared by a read operation, $\Sigma W_1 I_1$ and $\Sigma W_2 I_2$ can be compared.

Meanwhile, after setting the weight of the synapses connected to the first word-line of the first array and adjusting the state of the capacitor device to form a reference voltage expressing a specific value ($b_1$) in the first word-line of the second array, in a state in which both of the input signals are applied as 1, if the floating voltages of the word-lines are compared through a read operation, $\Sigma W_1 I_1$ and $b_1$ can be compared.

Referring to FIG. 8C, the synapse array according to the present embodiment may further include a second peripheral circuit that compares the floating voltage of the word-line of the array with a preset reference voltage and outputs the result. Meanwhile, the second peripheral circuit may be configured as a third peripheral circuit shown in FIG. 9.

Figure 9:
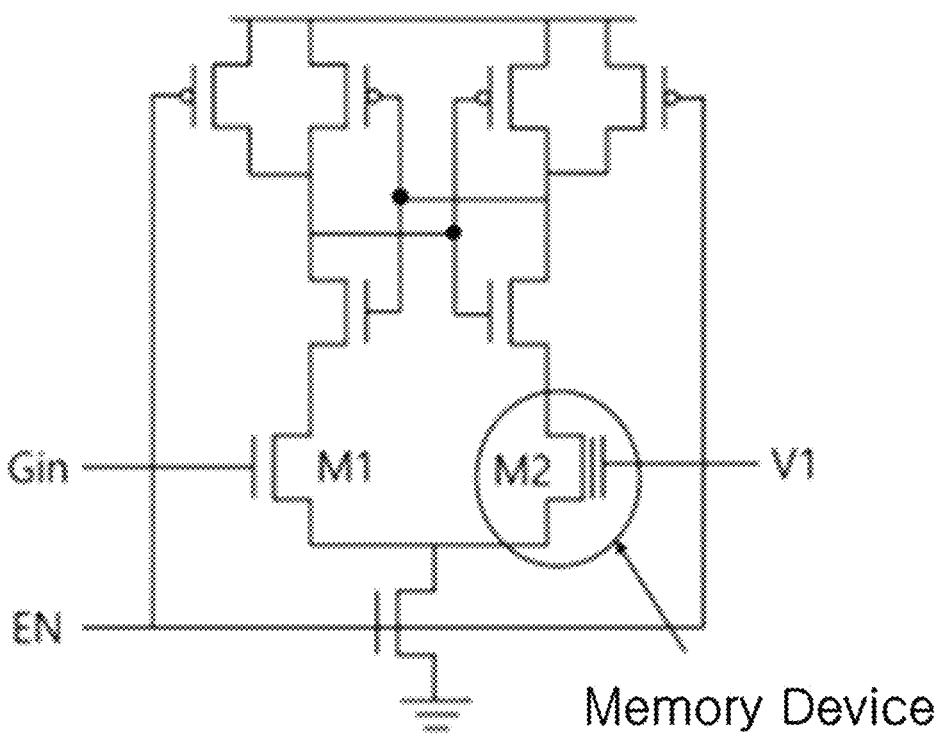
FIG. 9 is a circuit diagram exemplarily illustrating a third peripheral circuit for voltage comparison in a capacitor-based synapse array according to the third embodiment of the present invention.

FIG. 9 is a circuit diagram exemplarily illustrating a third peripheral circuit for voltage comparison in a capacitor-based synapse array according to the third embodiment of the present invention. At least one of the two input elements of the voltage comparator provided in the third peripheral circuit is configured as an input element having a nonvolatile memory function. The input element having the non-volatile memory function may have various conductance at a given voltage according to the polarity or amount of stored charges. The third peripheral circuit having the above-described configuration may provide an output by comparing a voltage of the word-line being in the floating state with a reference voltage in a state in which the input signal is applied.

The synapse array according to this embodiment includes a third peripheral circuit including a plurality of word-lines and a plurality of comparators to which a plurality of unit synapses are respectively connected. The plurality of comparators are configured to respectively compare the plurality of word-lines with a given reference voltage. At least one of the two input elements of the comparator is configured to have a non-volatile memory function, and the input element having the non-volatile memory function may have various conductance at a given voltage depending on the polarity or amount of stored charges. Accordingly, the third peripheral circuit compares the voltage of the word-line being in the floating state with the reference voltage to provide an output in a state in which the input signal is applied.

Conventional voltage comparators have a disadvantage in that they require a large area for generating a comparison voltage. However, in the structure according to the present invention, the area required to generate the comparison voltage can be reduced by configuring the comparator using the memory device capable of controlling the current by using the third peripheral circuit as described above.

In the above, the present invention has been mainly described with respect to preferred embodiments thereof, but this is merely an example and does not limit the scope of the present invention. Those of ordinary skill in the art to which the present invention pertains will appreciate that various modifications and applications not exemplified above are possible without departing from the essential characteristics of the present invention. And, the differences related to such modifications and applications should be construed as being included in the scope of the present invention defined in the appended claims.

What is claimed is:

1. A capacitor device, which comprises
a substrate having an insulating layer formed on a surface;
a semiconductor layer provided on the insulating layer, which includes first and second doping regions formed to be spaced apart from each other in the semiconductor layer and each doped with different types of impurities and a body region formed between the first doping region and the second doping region;
a gate electrode provided above the body region and electrically isolated from the body region; and
a gate insulator stack configured to have a memory function capable of storing information in a non-volatile form and disposed between the gate electrode and the semiconductor layer,
wherein a capacitance between the gate electrode and the first doping region is determined according to information stored in the gate insulator stack, and a state of the capacitor device is determined according to the capacitance to be one of two preset states.

2. The capacitor device according to claim 1, wherein the body region is formed to have a thickness smaller than that of the first and second doping regions, so that a ratio of capacitances for the two preset states is increased, and resistances of the first and second doping regions are reduced.

3. The capacitor device according to claim 1, wherein the body region is not doped with impurities, or is doped with the same type of impurity as the first doping region and with a concentration smaller than the doping concentration of the first doping region.

4. The capacitor device according to claim 1, wherein the gate insulator stack has a stack structure in which a charge storage layer and one or more insulating layers are stacked.

5. The capacitor device according to claim 4, wherein the gate insulator stack is configured to include an insulating layer having a thickness of 4 nm or less between the body region and the charge storage layer or not to include an insulating layer between the body region and the charge storage layer, so as to reduce program and erase operating voltages.

6. The capacitor device according to claim 1, wherein the gate insulator stack includes an insulating layer disposed on the semiconductor layer; and a ferroelectric layer disposed between the insulating layer and the gate electrode.

7. The capacitor device according to claim 1, wherein according to the information stored in the gate insulator stack, carriers are induced in the body region to form an accumulation layer or an inversion layer in the body region, or a carrier-free depletion state is formed in the body region, and
wherein there is no current flow between the first doping region and the second doping region.

8. A unit synapse, which comprises a pair of capacitor devices, the capacitor devices forming the pair share a gate electrode and are configured to have different states, wherein the capacitor device comprises
a substrate having an insulating layer formed on a surface of the substrate;
a semiconductor layer provided on the insulating layer, which includes first and second doping regions formed to be spaced apart from each other in the semiconductor layer and each doped with different types of impurities and a body region formed between the first doping region and the second doping region;
a gate electrode provided at least above the body region and electrically isolated from the body region; and
a gate insulator stack configured to have a memory function capable of storing information in a non-volatile form and disposed between the gate electrode and the semiconductor layer,
wherein the capacitance between the gate electrode and the first doping region is determined according to information stored in the gate insulator stack, and the state of the capacitor device is determined according to the capacitance to be one of two preset states.

9. The unit synapse according to claim 8, wherein the gate insulator stack of the capacitor device has a stack structure in which a charge storage layer and one or more insulating layers are stacked.

10. The unit synapse according to claim 8, wherein a first capacitor device constituting the unit synapse is characterized in that first carriers are stored in a charge storage layer of a gate insulator stack, and an inversion layer or an accumulation layer is formed in a body region by the stored first carriers, so that the body region is electrically connected to a first doping region of the first capacitor device; and a second capacitor device constituting the unit synapse is characterized in that second carriers of a type opposite to that of the first carrier are stored in a charge storage layer of a gate insulator stack, and a body region is depleted by the stored second carriers, so that the body region is not electrically connected to a first doping region of the second capacitor device.

11. The unit synapse according to claim 8, wherein a value corresponding to a weight is stored in the gate insulator stack of the capacitor device, a voltage corresponding to an input signal is applied to a first doping region of the capacitor device, and the voltage of the gate electrode of the capacitor device is set as an output signal.

12. A synapse array based on capacitor, which comprises a plurality of unit synapses arranged in an array form, the unit synapse comprises a pair of capacitor devices, the capacitor devices forming the pair share a gate electrode and are configured to have different states, wherein the capacitor device comprises a substrate having an insulating layer formed on its surface;

a semiconductor layer provided on the insulating layer, which first and second doping regions formed to be spaced apart from each other in the semiconductor layer and each doped with different types of impurities and a body region formed between the first doping region and the second doping region;

a gate electrode provided at least above the body region and electrically isolated from the body region; and a gate insulator stack configured to have a memory function capable of storing information in a non-volatile form and disposed between the gate electrode and the semiconductor layer, wherein the capacitance between the gate electrode and the first doping region is determined according to information stored in the gate insulator stack, and the state of the capacitor device is determined according to the capacitance to be one of two preset states.

13. The synapse array based on capacitor according to claim 12, wherein the gate insulator stack of the capacitor device has a stack structure in which a charge storage layer and one or more insulating layers are stacked.

14. The synapse array based on capacitor according to claim 12, wherein a first capacitor device constituting the unit synapse is characterized in that first carriers is stored in a charge storage layer of a gate insulator stack, and an inversion layer or an accumulation layer is formed in a body region by the stored first carriers, so that the body region is electrically connected to a first doping region of the first capacitor device; and a second capacitor device constituting the unit synapse is characterized in that second carriers of a type opposite to that of the first carriers are stored in a charge storage layer of a gate insulator stack, and a body region is depleted by the stored second carriers, so that the body region is not electrically connected to the first doping region of the second capacitor device.

15. The synapse array based on capacitor according to claim 12, wherein the first doping regions of the capacitor devices included in the synapse array are connected to each other and the second doping regions of the capacitor devices included in the synapse array are connected to each other, so as to reduce contact area of metal electrodes and increase the degree of integration.

16. The synapse array based on capacitor according to claim 12, wherein the synapse array further comprises a first peripheral circuit configured to apply an input signal to first electrodes connected to the first doping regions or to second electrodes connected to the second doping regions of the capacitor devices included in the synapse array.

17. The synapse array based on capacitor according to claim 12, wherein the synapse array further comprises:

a plurality of word-lines connected to each of the plurality of unit synapses; and a second peripheral circuit in which two word-lines form a pair and the second peripheral circuit comprises a plurality of comparators configured to compare the first and second word-lines of the pair, and wherein the weights of the synapses connected to the first and the second word-lines forming the pair are set to be opposite state to each other, and the second peripheral circuit is configured to provide an output by comparing the voltages of the word-lines being in a floating state through a read operation in a state in which the same input signals are applied.

18. The synapse array based on capacitor according to claim 12, wherein the synapse array further comprises:

a plurality of word-lines connected to each of the plurality of unit synapses; and a second peripheral circuit in which two word-lines constitute a pair and the second peripheral circuit comprises a plurality of comparators configured to compare the first and second word-lines constituting the pair, and wherein synapses connected to the first word-line constituting the pair are set to have weight information and synapses connected to the second word-line are set to have information forming a reference voltage, and the second peripheral circuit is configured to provide an output by comparing the voltages of the word-lines being in a floating state through a read operation in a state in which each input signal is applied.

19. The synapse array based on capacitor according to claim 12, wherein the synapse array further comprises:

a plurality of word-lines connected to each of the plurality of unit synapses; and a second peripheral circuit including a plurality of comparators configured to respectively compare the plurality of word-lines with a reference voltage; and wherein the second peripheral circuit is configured to provide an output by comparing a voltage of a word-line being in a floating state with a reference voltage through a read operation in a state in which input signal is applied.

20. The synapse array based on capacitor according to claim 12, wherein the synapse array further comprises: a plurality of word-lines connected to each of the plurality of unit synapses; and a second peripheral circuit including a plurality of comparators configured to respectively compare the plurality of word-lines with a reference voltage, and wherein at least one of the two input elements of the comparator is an element having a non-volatile memory function, and the conductance of the input element having a non-volatile memory function is determined according to the polarity or amount of charge stored in the input voltage, and the second peripheral circuit is configured to provide an output by comparing a voltage of the word-line being in a floating state with a reference voltage through a read operation in a state in which input signal is applied.

* * * * *